United States Patent
Chou et al.

(10) Patent No.: US 8,025,931 B2
(45) Date of Patent: Sep. 27, 2011

(54) FILM FORMATION APPARATUS FOR SEMICONDUCTOR PROCESS AND METHOD FOR USING THE SAME

(75) Inventors: Pao-Hwa Chou, Nirasaki (JP); Kazuhide Hasebe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 596 days.

(21) Appl. No.: 11/822,979

(22) Filed: Jul. 11, 2007

(65) Prior Publication Data

US 2008/0014758 A1    Jan. 17, 2008

(30) Foreign Application Priority Data

Jul. 13, 2006 (JP) ................................ 2006-192991

(51) Int. Cl.
C23C 16/00 (2006.01)

(52) U.S. Cl. .................................... 427/569; 118/723 R

(58) Field of Classification Search ........................ None
See application file for complete search history.

(56) References Cited

U.S. PATENT DOCUMENTS

| | | | |
|---|---|---|---|
| 7,094,708 B2 | 8/2006 | Kato et al. | |
| 2003/0224618 A1 | 12/2003 | Sato et al. | |
| 2003/0231684 A1* | 12/2003 | Yagi et al. | 372/46 |
| 2004/0240971 A1* | 12/2004 | Tezuka et al. | 414/217 |
| 2005/0066993 A1* | 3/2005 | Hasebe et al. | 134/1 |
| 2005/0221001 A1* | 10/2005 | Joe et al. | 427/248.1 |
| 2005/0255712 A1* | 11/2005 | Kato et al. | 438/791 |
| 2006/0213539 A1* | 9/2006 | Hasebe et al. | 134/22.1 |
| 2007/0181145 A1* | 8/2007 | Ishizuka et al. | 134/1.1 |

FOREIGN PATENT DOCUMENTS

| | | |
|---|---|---|
| EP | 1 638 139 | 3/2006 |
| JP | 06-045256 | 2/1994 |
| JP | 8-22981 | 1/1996 |
| JP | 11-087341 | 3/1999 |
| JP | 2004-343017 | 12/2004 |
| JP | 2005-167027 | 6/2005 |
| JP | 2005-340787 | 12/2005 |
| JP | 2006-049808 | 2/2006 |
| WO | WO 2004/066377 | 8/2004 |
| WO | WO2004/066377 | * 8/2004 |
| WO | WO2004/086482 | * 10/2004 |
| WO | WO2005/074016 | * 8/2005 |

OTHER PUBLICATIONS

Chinese Office Action issued on Oct. 30, 2009 for Chinese Application No. 2007101494102 w/partial English language translation.

(Continued)

Primary Examiner — Timothy Meeks
Assistant Examiner — Joseph Miller, Jr.
(74) Attorney, Agent, or Firm — Smith, Gambrell & Russell, LLP

(57) ABSTRACT

A method for using a film formation apparatus performs a first film formation process, while supplying a first film formation gas into a process field inside a process container, thereby forming a first thin film on a first target substrate inside the process field. After unloading the first target substrate from the process container, the method performs a cleaning process of an interior of the process container, while supplying a cleaning gas into the process field, and generating plasma of the cleaning gas by an exciting mechanism. Then, the method performs a second film formation process, while supplying a second film formation gas into the process field, thereby forming a second thin film on a target substrate inside the process field. The second film formation process is a plasma film formation process that generates plasma of the second film formation gas by the exciting mechanism.

12 Claims, 6 Drawing Sheets

OTHER PUBLICATIONS

Japanese Office Action issued on Jul. 22, 2008 for Japanese Application No. 2006-192991.

Chinese Office Action mailed on Apr. 7, 2010 for Chinese Application No. 200710149410.2 w/English translation.

* cited by examiner

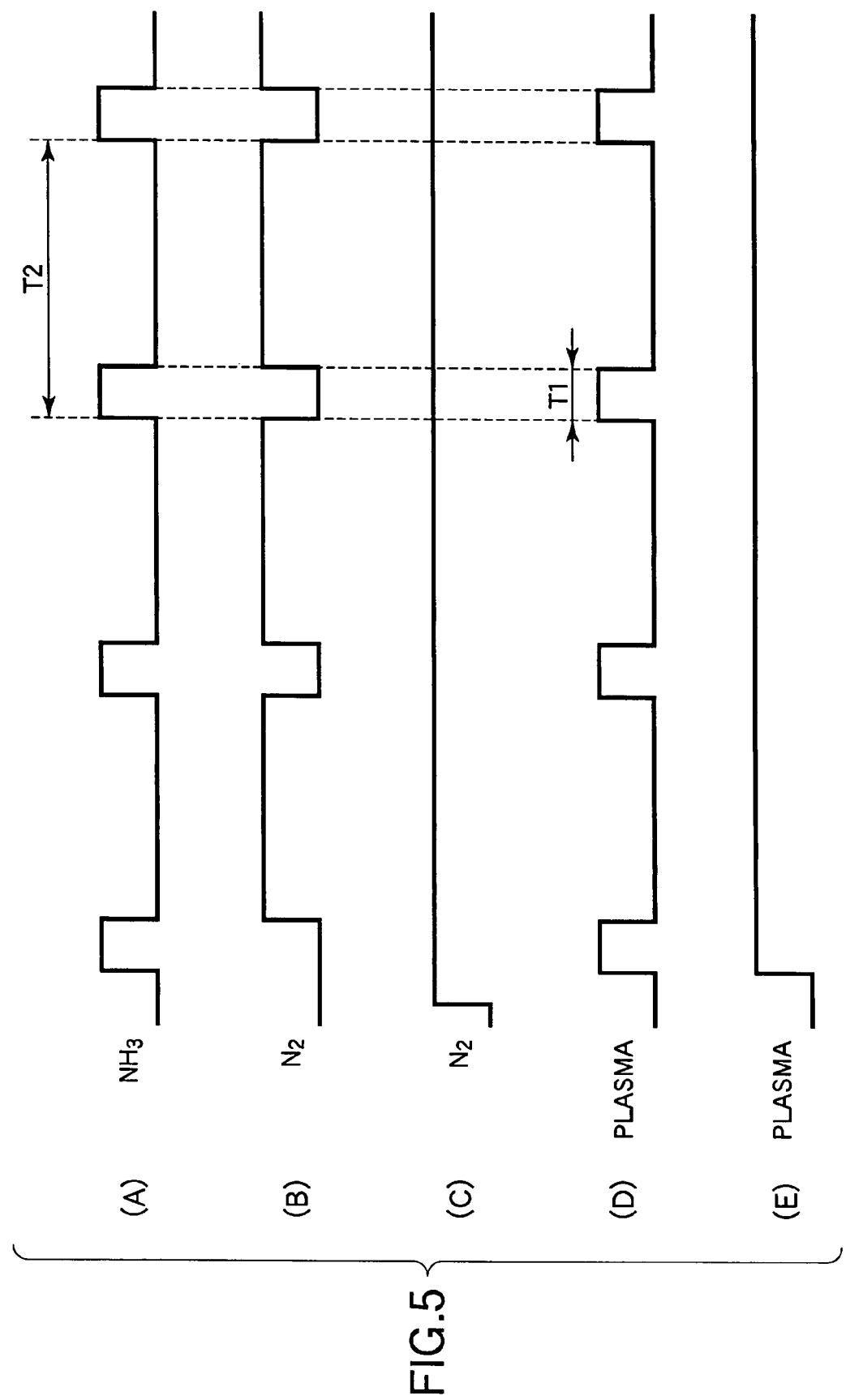

FILM FORMATION APPARATUS FOR SEMICONDUCTOR PROCESS AND METHOD FOR USING THE SAME

BACKGROUND OF THE INVENTION

1. Field of the Invention

The present invention relates to a film formation apparatus for a semiconductor process for forming a film on a target substrate, such as a semiconductor wafer, and also to a method for using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer (made of, e.g., silicon) is subjected to various processes, such as film formation, etching, oxidation, diffusion, reformation, annealing, and natural oxide film removal. US 2003/0224618 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rates, process pressures, and process temperatures, are controlled.

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD (Chemical Vapor Deposition) method for a film formation process, which performs film formation while intermittently supplying a source gas and so forth to repeatedly form layers each having an atomic or molecular level thickness, one by one, or several by several (for example, Jpn. Pat. Appln. KOKAI Publications No. 6-45256 and No. 11-87341). In general, this film formation method is called ALD (Atomic Layer Deposition) or MLD (Molecular Layer Deposition), which allows a predetermined process to be performed without exposing wafers to a very high temperature.

Further, WO 2004/066377 (Dec. 15, 2004), which corresponds to U.S. Pat. No. 7,094,708 B2, discloses a structure of a vertical processing apparatus for performing ALD, which utilizes plasma assistance to further decrease the process temperature. According to this apparatus, for example, where dichlorosilane (DCS) and $NH_3$ are used as a silane family gas and a nitriding gas, respectively, to form a silicon nitride film (SiN), the process is performed, as follows. Specifically, DCS and $NH_3$ gas are alternately and intermittently supplied into a process container with purge periods interposed therebetween. When $NH_3$ gas is supplied, an RF (radio frequency) is applied to generate plasma so as to promote a nitridation reaction. More specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness. Apparatus of this type are also disclosed in Jpn. Pat. Appln. KOKAI Publications No. 2005-340787, No. 2006-49808, and No. 2005-167027.

BRIEF SUMMARY OF THE INVENTION

An object of the present invention is to provide a film formation apparatus for a semiconductor process and a method for using the same, which can suppress a problem, such as particle contamination, found by the present inventors, as described later, in broadening the application range of a film formation apparatus utilizing plasma assistance.

According to a first aspect of the present invention, there is provided a method for using a film formation apparatus for a semiconductor process, the apparatus comprising a process container having a process field configured to accommodate a target substrate, a support member configured to support the target substrate inside the process field, a heater configured to heat the target substrate inside the process field, an exciting mechanism including a plasma generation area inside a space communicating with the process field, a gas supply system configured to supply a process gas into the process field, and an exhaust system configured to exhaust gas from the process field, and the method comprising:

performing a first film formation process, while supplying a first film formation gas into the process field, thereby forming a first thin film on a first target substrate inside the process field;

after unloading the first target substrate from the process container, performing a cleaning process of an interior of the process container, while supplying a cleaning gas into the process field, and generating plasma of the cleaning gas by the exciting mechanism; and then, performing a second film formation process, while supplying a second film formation gas into the process field, thereby forming a second thin film on a target substrate inside the process field, the second film formation process being a plasma film formation process that comprises generating plasma of the second film formation gas by the exciting mechanism.

According to a second aspect of the present invention, there is provided a film formation apparatus for a semiconductor process, the apparatus comprising:

a process container having a process field configured to accommodate a target substrate;

a support member configured to support the target substrate inside the process field;

a heater configured to heat the target substrate inside the process field;

an exciting mechanism including a plasma generation area inside a space communicating with the process field;

a gas supply system configured to supply a process gas into the process field;

an exhaust system configured to exhaust gas from the process field; and a control section configured to control an operation of the apparatus, the control section executes performing a first film formation process, while supplying a first film formation gas into the process field, thereby forming a first thin film on a first target substrate inside the process field;

after unloading the first target substrate from the process container, performing a cleaning process of an interior of the process container, while supplying a cleaning gas into the process field, and generating plasma of the cleaning gas by the exciting mechanism; and then, performing a second film formation process, while supplying a second film formation gas into the process field, thereby forming a second thin film on a target substrate inside the process field, the second film formation process being a plasma film formation process that comprises generating plasma of the second film formation gas by the exciting mechanism.

According to a third aspect of the present invention, there is provided a computer readable storage medium containing program instructions for execution on a processor used for a film formation apparatus for a semiconductor process, the apparatus comprising a process container having a process field configured to accommodate a target substrate, a support member configured to support the target substrate inside the process field, a heater configured to heat the target substrate inside the process field, an exciting mechanism including a plasma generation area inside a space communicating with the process field, a gas supply system configured to supply a process gas into the process field, and an exhaust system configured to exhaust gas from the process field, wherein the program instructions, when executed by the processor, cause the film formation apparatus to execute:

performing a first film formation process, while supplying a first film formation gas into the process field, thereby forming a first thin film on a first target substrate inside the process field;

after unloading the first target substrate from the process container, performing a cleaning process of an interior of the process container, while supplying a cleaning gas into the process field, and generating plasma of the cleaning gas by the exciting mechanism; and then, performing a second film formation process, while supplying a second film formation gas into the process field, thereby forming a second thin film on a target substrate inside the process field, the second film formation process being a plasma film formation process that comprises generating plasma of the second film formation gas by the exciting mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5 is a timing chart showing gas supply and RF (radio frequency) application used in a cleaning process according to the embodiment of the present invention;

DETAILED DESCRIPTION OF THE INVENTION

Figure 1:
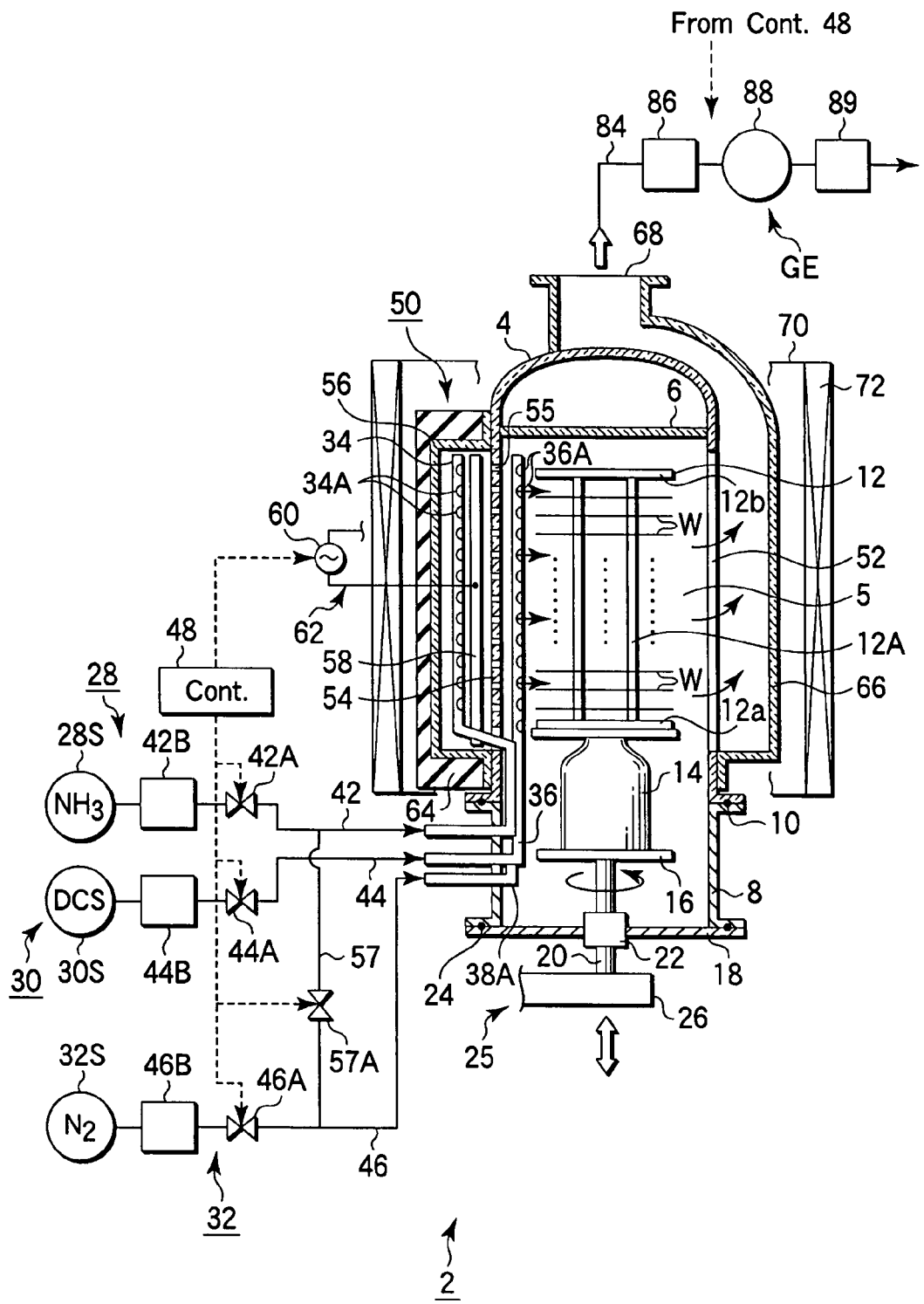
FIG. 1 is a sectional view showing a vertical plasma film formation apparatus according to an embodiment of the present invention.

In the process of developing the present invention, the inventors studied problems to be caused in broadening the application range of film formation apparatuses utilizing plasma assistance. As a result, the inventors have arrived at the findings given below.

Specifically, film formation apparatuses utilizing plasma assistance includes a mechanism for generating plasma and thus can be very expensive. It is therefore preferably for film formation apparatuses of this kind to be usable for performing a process using no plasma, such as a plasma-less film formation process. Where a plasma-less film formation process, such as a thermal CVD process or a thermal ALD or MLD process, is performed to form a film in a film formation apparatus of this kind, the RF power supply for plasma generation is set in the OFF-state. Further, wafers inside the process container are heated to and set at a predetermined temperature by a heater, and a necessary gas is supplied into the process container in this state.

However, when the plasma-less film formation process is performed, unnecessary by-product films are deposited on the inner walls of the process container and plasma chamber. The by-product films are partly peeled off from the inner walls when a plasma film formation process is performed after the plasma-less film formation process, due to the impact of plasma generation and the sputtering action of plasma. Consequently, particles are generated and deposited on the wafers. This particle generation is caused at a level of cumulative film thickness at which no particle generation is caused where the same film formation process is repeated. In general, plasma-less film formation processes entail a larger quantity of by-product films than that generated by plasma film formation processes.

Conventionally, there is a cleaning process for the interior of a process container by use of an etching gas of a halogen family, such as F family or Cl family, e.g., $NF_3$ gas or $ClF_3$ gas. However, where such a cleaning process using a halogen family gas is performed, it takes time to satisfactorily remove residual components of the F or Cl family from the process container. Further, a pre-coating process is required to set the inner wall of the process container at a predetermined condition. Consequently, the cleaning operation takes a long time, thereby decreasing the operation rate of the film formation apparatus as a whole.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
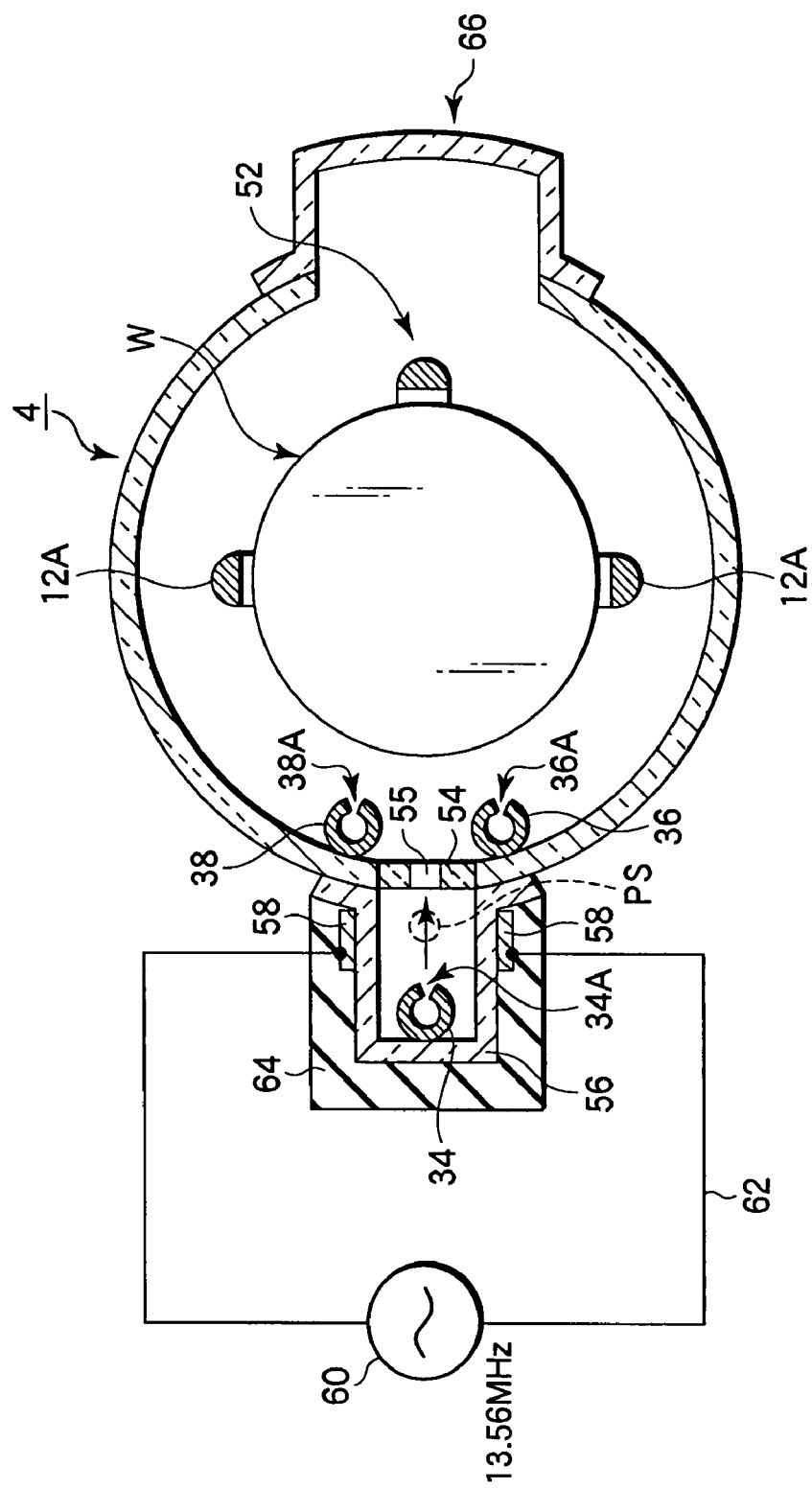
FIG. 2 is a sectional plan view showing part of the apparatus shown in FIG. 1.

FIG. 1 is a sectional view showing a vertical plasma film formation apparatus according to an embodiment of the present invention. FIG. 2 is a sectional plan view showing part of the apparatus shown in FIG. 1. The film formation apparatus 2 has a process field configured to be selectively supplied with a first process gas containing dichlorosilane (DCS) gas as a silane family gas, a second process gas containing ammonia ($NH_3$) gas as a nitriding gas, and an assist gas comprising an inactive gas, such as $N_2$ gas. The film formation apparatus 2 is configured to form a silicon nitride film on target substrates by CVD in the process field.

The apparatus 2 includes a process container (reaction chamber) 4 shaped as a cylindrical column with a ceiling and an opened bottom, in which a process field 5 is defined to accommodate and process a plurality of semiconductor wafers (target substrates) stacked at intervals. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The cylindrical manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down in unison. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a second process gas supply circuit 28, a first process gas supply circuit 30, and an assist gas supply circuit 32. The first process gas supply circuit 30 is arranged to supply a first process gas containing a silane family gas, such as DCS (dichlorosilane: $SiH_2Cl_2$) gas. The second process gas supply circuit 28 is arranged to supply a second process gas containing a nitriding gas, such as ammonia ($NH_3$) gas. The ammonia gas is also used as a cleaning gas for generating plasma during a cleaning process. The assist gas supply circuit 32 is arranged to supply an inactive gas, such as $N_2$ gas, as a purge gas or an assist gas for adjusting pressure. Each of the first and second process gases may be mixed with a suitable amount of carrier gas (such as $N_2$ gas), as needed. However, such a carrier gas will not be mentioned, hereinafter, for the sake of simplicity of explanation.

More specifically, the second process gas supply circuit 28, first process gas supply circuit 30, and assist gas supply circuit 32 include gas distribution nozzles 34, 36, and 38, respectively, each of which is formed of a quartz pipe which penetrates the sidewall of the manifold 8 from the outside and then turns and extends upward (see FIG. 2). The gas distribution nozzles 34, 36, and 38 respectively have a plurality of gas spouting holes 34A, 36A, and 38A, each set being formed at predetermined intervals in the longitudinal direction (the vertical direction) over all the wafers W on the wafer boat 12.

The nozzles 34, 36, and 38 are connected to gas sources 28S, 30S, and 32S of $NH_3$ gas, DCS gas, and $N_2$ gas, respectively, through gas supply lines (gas passages) 42, 44, and 46, respectively. The gas supply lines 42, 44, and 46 are provided with switching valves 42A, 44A, and 46A and flow rate controllers 42B, 44B, and 46B, such as mass flow controllers, respectively. With this arrangement, $NH_3$ gas, DCS gas, and $N_2$ gas can be supplied at controlled flow rates. The gas supply line 46 of the assist gas consisting of $N_2$ gas is connected to the gas supply line 42 of the second process gas through a line 47 provided with a switching valve 47A. As needed, the switching valve 47A and so forth are controlled, so that $N_2$ gas is spouted from the gas distribution nozzle 34.

A gas exciting section 50 is formed at the sidewall of the process container 4 in the vertical direction. On the side of the process container 4 opposite to the gas exciting section 50, a long and thin exhaust port 52 for vacuum-exhausting the inner atmosphere is formed by cutting the sidewall of the process container 4 in, e.g., the vertical direction.

Specifically, the gas exciting section 50 has a vertically long and thin opening formed by cutting a predetermined width of the sidewall of the process container 4, in the vertical direction. The opening is closed by a partition plate 54 having a gas passage 55 and is covered with a quartz cover 56 airtightly connected to the outer surface of the process container 4. The cover 56 has a vertically long and thin shape with a concave cross-section, so that it projects outward from the process container 4.

With this arrangement, the gas exciting section 50 is formed such that it projects outward from the sidewall of the process container 4 and is connected on the other side to the interior of the process container 4. In other words, the inner space of the gas exciting section 50 communicates through the gas passage 55 of the partition plate 54 with the process field 5 within the process container 4. The partition plate 54 has a vertical length sufficient to cover all the wafers W on the wafer boat 12 in the vertical direction. The partition plate 54 decreases the gas flow conductance between the gas exciting section 50 and process field 5. Consequently, the pressure of the gas exciting section 50 can be increased without adversely affecting the process field 5 in terms of pressure.

A pair of long and thin electrodes 58 are disposed on the opposite outer surfaces of the cover 56, and face each other while extending in the longitudinal direction (the vertical direction). The electrodes 58 are connected to an RF (Radio Frequency) power supply 60 for plasma generation, through feed lines 62. An RF voltage of, e.g., 13.56 MHz is applied to the electrodes 58 to form an RF electric field for exciting plasma between the electrodes 58. The frequency of the RF voltage is not limited to 13.56 MHz, and it may be set at another frequency, e.g., 400 kHz.

The gas distribution nozzle 34 of the second process gas is bent outward in the radial direction of the process container 4 and penetrates the partition plate 54, at a position lower than the lowermost wafer W on the wafer boat 12. Then, the gas distribution nozzle 34 vertically extends at the deepest position (the farthest position from the center of the process container 4) in the gas exciting section 50. As also shown in FIG. 2, the gas distribution nozzle 34 is separated outward from an area sandwiched between the pair of electrodes 58 (a position where the RF electric field is most intense), i.e., a plasma generation area PS where the main plasma is actually generated. The second process gas-containing $NH_3$ gas is spouted from the gas spouting holes 34A of the gas distribution nozzle 34 toward the plasma generation area PS. Then, the second process gas is excited (decomposed or activated) in the plasma generation area PS, and is supplied in this state through the gas passage 55 of the partition plate 54 onto the wafers W on the wafer boat 12.

An insulating protection cover 64 made of, e.g., quartz is attached to and covers the outer surface of the cover 56. A cooling mechanism (not shown) is disposed in the insulating protection cover 64 and comprises coolant passages respectively facing the electrodes 58. The coolant passages are supplied with a coolant, such as cooled nitrogen gas, to cool the electrodes 58. The insulating protection cover 64 is covered with a shield (not shown) disposed on the outer surface to prevent RF leakage.

The gas distribution nozzles 36 and 38 of the first process gas and assist gas extend upward and face each other at positions near and outside the partition plate 54 of the gas exciting section 50, i.e., on both sides of the outside of the partition plate 54 (in the process container 4). The first process gas containing DCS gas and the assist gas consisting of $N_2$ gas are spouted from the gas spouting holes 36A and 38A of the gas distribution nozzles 36 and 38, respectively, toward the center of the process container 4. The gas spouting holes 36A and 38A are formed at positions between the wafers W on the wafer boat 12 to respectively deliver the first process gas (containing DCS) and assist gas ($N_2$ gas) essentially uniformly in the horizontal direction, so as to form gas flows parallel with the wafers W.

On the other hand, the exhaust port 52, which is formed opposite the gas exciting section 50, is covered with an exhaust port cover member 66. The exhaust port cover member 66 is made of quartz with a U-shape cross-section, and attached by welding. The exhaust port cover member 66 extends upward along the sidewall of the process container 4, and has a gas outlet 68 at the top of the process container 4. The gas outlet 68 is connected to a vacuum-exhaust system GE including a vacuum pump and so forth. The vacuum exhaust system GE has an exhaust passage 84 connected to the gas outlet 68, on which a valve unit (an opening degree adjustment valve) 86, a vacuum pump 88, and a detoxification unit 89 for removing undesirable substances are disposed in this order from the upstream side.

The process container 4 is essentially airtightly surrounded by a heat-insulating casing 70. The casing 70 is provided with a heater 72 on the inner surface for heating the atmosphere and wafers W inside the process container 4. For example, the heater 72 is formed of a carbon wire, which causes no contamination and has good characteristics for increasing and decreasing the temperature. A thermocouple (not shown) is disposed near the exhaust port 52 in the process container 4 to control the heater 72.

Figure 3:
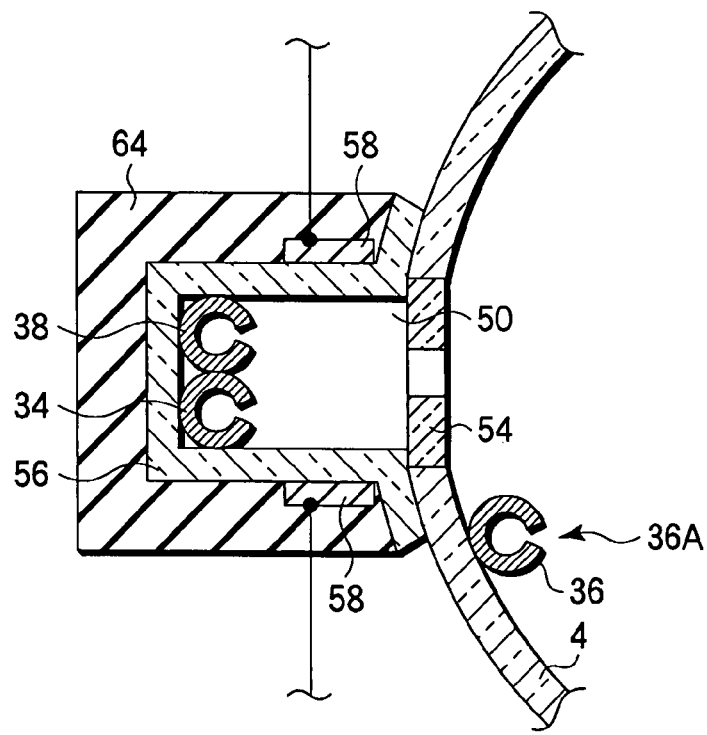
FIG. 3 is a sectional plan view showing part of a modification of the apparatus shown in FIG. 1.

FIG. 3 is a sectional plan view showing part of a modification of the apparatus shown in FIG. 1. In this modification, the gas distribution nozzle 38 of the assist gas vertically extends at the deepest position in the gas exciting section 50 along with the gas distribution nozzle 34 of the second process gas, side by side.

The film formation apparatus 2 further includes a main control section 48 formed of, e.g., a computer, to control the entire apparatus. The main control section 48 can control the film formation process described below in accordance with the process recipe of the film formation process concerning, e.g., the film thickness and composition of a film to be formed, stored in the memory thereof in advance. In the memory, the relationship between the process gas flow rates and the thickness and composition of the film is also stored as control data in advance. Accordingly, the main control section 48 can control the elevating mechanism 25, gas supply circuits 28, 30, and 32, exhaust system GE (including the valve unit 86), gas exciting section 50, heater 72, and so forth, based on the stored process recipe and control data.

Figure 7:
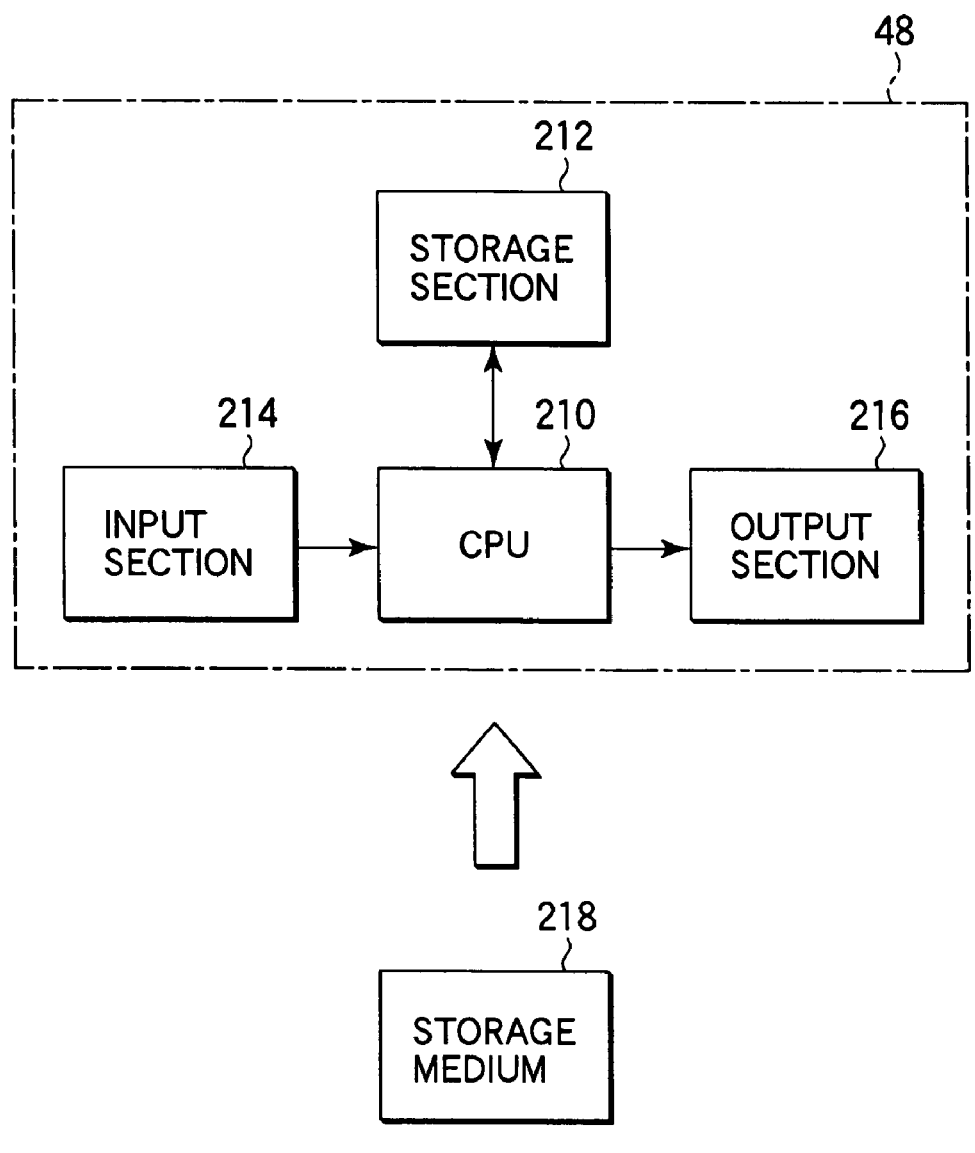
FIG. 7 is a block diagram schematically showing the structure of a main control section used in the apparatus shown in FIG. 1.

FIG. 7 is a block diagram schematically showing the structure of the main control section 48 of the apparatus shown in FIG. 1. The main control section 48 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 7 also shows a storage medium 218 attached to the computer in a removable state.

The film formation method described below may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described below.

Figure 4:
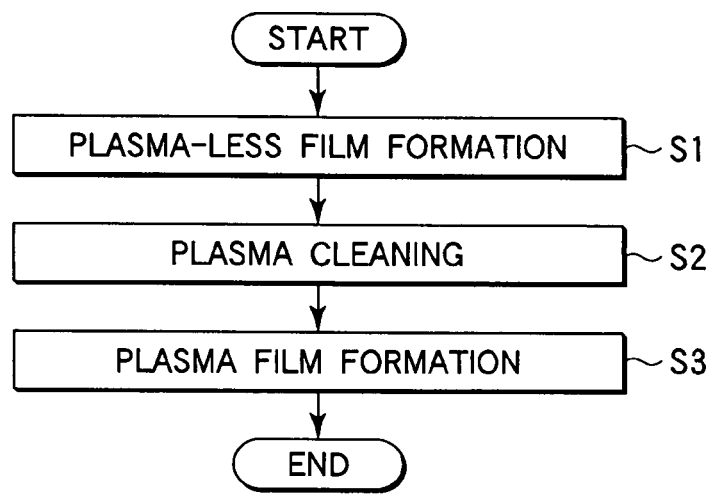
FIG. 4 is a flowchart showing the outline of a method for using the apparatus according to the embodiment of the present invention.

Next, an explanation will be given of a method for using the film formation apparatus 2 shown in FIG. 1. FIG. 4 is a flowchart showing the outline of a method for using the apparatus according to the embodiment of the present invention.

The film formation apparatus 2 shown in FIG. 1 can be selectively used to perform a plasma film formation process and a plasma-less film formation process. For example, the plasma-less film formation process corresponds to a thermal CVD process or a thermal ALD or MLD process. When a plasma-less film formation process is performed (Step S1 in FIG. 4), by-product films are deposited on the inner walls of the process container 4 and the cover 56 defining the gas exciting section 50.

Where the plasma-less film formation process is repeatedly performed continuously for a plurality batches, by-product films may be cleaned by a dry cleaning or wet cleaning process, as usual, when the cumulative film thickness of the film formation process exceeds a predetermined value. However, when a plasma film formation process (Step S3 in FIG. 4) is performed after the plasma-less film formation process, even if by-product films are thin, they are partly peeled off from the inner walls (particularly the inner wall of the cover 56) due to the impact of plasma generation and the sputtering action of plasma. Consequently, particles are generated and deposited on the wafers. For example, the plasma film formation process corresponds to a plasma CVD process or a plasma ALD or MLD process.

For this reason, as shown in FIG. 4, particularly when processes are switched from the plasma-less film formation process (Step S1) to the plasma film formation process (Step S3), a plasma cleaning process (Step S2) is performed immediately before the plasma film formation process. This cleaning process is conceived to remove by-product films in advance even if they are thin, so that particles are note generated during the plasma film formation process of Step S3.

To be more precise, where an ordinary thermal CVD process is performed as the plasma-less film formation process (Step S1), operations are conducted as follows. Specifically, the wafer boat 12 at room temperature, which supports a number of, e.g., 50 to 100, wafers W having a diameter of 300 mm, is loaded into the process container 4 heated at a predetermined temperature. Then, the interior of the process container 4 is vacuum-exhausted and kept at a predetermined process pressure, and the wafer temperature is increased by the heater 72 to a film formation process temperature of 650 to 800□, such as 750□. At this time, the apparatus is in a waiting state until the temperature becomes stable. Then, the first process gas containing DCS gas and the second process gas containing $NH_3$ gas are continuously supplied together from the respective gas distribution nozzles 36 and 34 at controlled flow rates. At this time, the wafer boat 32 is rotated along with the wafers W supported thereon. During the thermal CVD process, the RF power supply 60 is set in the OFF-state, so that no plasma is generated.

The first process gas containing DCS gas is supplied from the gas spouting holes 36A of the gas distribution nozzle 36 to form gas flows parallel with the wafers W. On the other hand, the second process gas containing $NH_3$ gas is supplied from the gas spouting holes 34A of the gas distribution nozzle 34 through the gas passage 55 of the partition plate 54 to form horizontal gas flows parallel with the wafers W. While being supplied between the wafers W, the DCS gas and $NH_3$ gas undergo decomposition and reaction by use of thermal energy applied from the heater 72. Consequently, a film formation material is provided, so that a silicon nitride film is formed on the wafers W. The gases thus used are exhausted form the exhaust port 52 formed on the side opposite to the partition plate 54.

Where a thermal ALD or MLD process is performed as the plasma-less film formation process (Step S1), operations are conducted as follows. Specifically, the wafer boat 12 with wafers W supported thereon is loaded into the process container 4, as in the case described above. Then, the interior of the process container 4 is vacuum-exhausted and kept at a predetermined process pressure, and the wafer temperature is increased by the heater 72 to a film formation process temperature of 550 to 650□, such as 600□. At this time, the apparatus is in a waiting state until the temperature becomes stable. Then, the first process gas containing DCS gas and the second process gas containing $NH_3$ gas are alternately and intermittently supplied from the respective gas distribution nozzles 36 and 34 at controlled flow rates. At this time, the wafer boat 32 is rotated along with the wafers W supported thereon. During the thermal ALD or MLD process, the RF power supply 60 is set in the OFF-state, so that no plasma is generated.

The first process gas containing DCS gas is supplied from the gas spouting holes 36A of the gas distribution nozzle 36 to form gas flows parallel with the wafers W. While being supplied, molecules of DCS gas and molecules and atoms of decomposition products generated by its decomposition (by use of thermal energy applied from the heater 72) are adsorbed on the wafers W. On the other hand, the second process gas containing $NH_3$ gas is supplied from the gas spouting holes 34A of the gas distribution nozzle 34 through the gas passage 55 of the partition plate 54 to form horizontal gas flows parallel with the wafers W. While being supplied, molecules of $NH_3$ gas and molecules and atoms of decomposition products generated by its decomposition. (by use of thermal energy applied from the heater 72) react with molecules of DCS gas adsorbed on the surface of the wafers W, so that a silicon nitride film is formed on the wafers W.

Immediately after the step of supplying the first process gas containing DCS gas, and immediately after the step of supplying the second process gas containing $NH_3$ gas, the assist gas consisting of $N_2$ gas is supplied as a purge gas into the process field 5. The assist gas is supplied from the gas spouting holes 38A of the gas distribution nozzle 38 to form gas flows parallel with the wafers W on the wafer boat 12. The assist gas flows thus formed serve to forcibly remove residual components within the process field 5, such as DCS gas and its decomposition products or $NH_3$ gas and its decomposition products. A cycle comprising these steps is repeated a number of times, and thin films of silicon nitride formed by respective cycles are laminated, thereby arriving at a silicon nitride film having a target thickness.

After the plasma-less film formation process, the wafer boat 32 with wafer W supported thereon is unloaded. Thereafter, the cleaning process (Step S2) is performed, as described later in detail, and the plasma film formation process (Step S3) is then performed. The cleaning process may be performed, after the wafer boat 12 used in the former process is set in an empty state with no wafers W supported thereon and is loaded into the process container 4. Alternatively, the cleaning process may be performed without, any wafer boat 12 loaded in the process container 4.

Where a plasma ALD or MLD process is performed as the plasma film formation process (Step S3), operations are conducted as follows. Specifically, the wafer boat 12 with wafers W supported thereon is loaded into the process container 4, as in the case described above. Then, the interior of the process container 4 is vacuum-exhausted and kept at a predetermined process pressure, and the wafer temperature is increased by the heater 72 to a film formation process temperature of 300 to 650□, such as 600□. At this time, the apparatus is in a waiting state until the temperature becomes stable. Then, the first process gas containing DCS gas and the second process gas containing $NH_3$ gas are alternately and intermittently supplied from the respective gas distribution nozzles 36 and 34 at controlled flow rates. At this time, the wafer boat 32 is rotated along with the wafers W supported thereon.

The first process gas containing DCS gas is supplied from the gas spouting holes 36A of the gas distribution nozzle 36 to form gas flows parallel with the wafers W. While being supplied, molecules of DCS gas and molecules and atoms of decomposition products generated by its decomposition are adsorbed on the wafers W. On the other hand, the second process gas containing $NH_3$ gas is supplied from the gas spouting holes 34A of the gas distribution nozzle 34 to form horizontal gas flows toward the gas passage 55 of the partition plate 54. The second process gas is selectively excited and partly turned into plasma when it passes through the plasma generation area PS between the pair of electrodes 58. At this time, for example, radicals (activated species), such as N*, NH*, NH$_2$*, and NH$_3$*, are produced (the symbol [*] denotes that it is a radical). The radicals flow out from the gas passage 55 of the gas exciting section 50 toward the center of the process container 4, and are supplied into gaps between the wafers W in a laminar flow state. The radicals react with molecules of DCS gas adsorbed on the surface of the wafers W, so that a silicon nitride film is formed on the wafers W.

Immediately after the step of supplying the first process gas containing DCS gas, and immediately after the step of supplying the second process gas containing NH$_3$ gas, the assist gas consisting of N$_2$ gas is supplied as a purge gas into the process field 5. The assist gas is supplied from the gas spouting holes 38A of the gas distribution nozzle 38 to form gas flows parallel with the wafers W on the wafer boat 12. The assist gas flows thus formed serve to forcibly remove residual components within the process field 5, such as DCS gas and its decomposition products or NH$_3$ gas and its decomposition products. A cycle comprising these steps is repeated a number of times, and thin films of silicon nitride formed by respective cycles are laminated, thereby arriving at a silicon nitride film having a target thickness.

Since the plasma ALD or MLD process utilizes plasma assistance to form a silicon nitride film, the film formation can be performed at a process temperature lower than that of the thermal ALD or MLD process described above. When plasma of the second process gas containing NH$_3$ gas is generated, the electric power applied to the RF power supply 60 is set at, e.g., about 300 watts.

In place of the plasma ALD or MLD process, a plasma CVD process may be performed as the plasma film formation process (Step S3). In this case, the first process gas containing DCS gas and the second process gas containing NH$_3$ gas are continuously supplied together, while plasma is continuously generated to produce radicals of NH$_3$ gas. Also in this case, the electric power applied to the RF power supply 60 is set at, e.g., about 300 watts. In the plasma ALD or MLD process or plasma CVD process, the process temperature can be set to be lower than 650☐, for example.

Next, an explanation will be given of the cleaning process (Step S2). FIG. 5 is a timing chart showing gas supply and RF (radio frequency) application used in a cleaning process according to the embodiment of the present invention.

Where the cleaning process is performed, after the wafers W processed by the plasma-less film formation process (Step S1) are unloaded, the wafer boat 12 used in this former process is set in an empty state with no wafers W supported thereon and is loaded into the process container 4. Alternatively, the cleaning process may be performed without any empty wafer boat 12 loaded in the process container 4. In the latter case, the port of the process container 4 (i.e., the bottom port of the manifold 8) is closed by a shutter disposed near the port in a well-known manner.

Then, the interior of the process container 4 is set at a predetermined process pressure, and NH$_3$ gas used as a cleaning gas that can be excited into plasma is then intermittently supplied from the gas distribution nozzle 34 in a predetermined cycle (FIG. 5, (A)). In a period of stopping NH$_3$ gas in this cycle (gap period), an inactive gas, such as N$_2$ gas, is supplied from the gas distribution nozzle 34 (FIG. 5, (B)). The N$_2$ gas thus supplied is used for promoting removal of peeled thin films. When N$_2$ gas is supplied from the nozzle 34, the switching valve 47A of the line 47 shown in FIG. 1 is set in an open state. At the same time, an inactive gas, such as N$_2$ gas, is continuously supplied from the distribution nozzle 38 inside the process container 4 (FIG. 5, (C)). This N$_2$ gas is used for further promoting removal of peeled thin films.

Further, in synchronism with the supply timing of NH$_3$ gas, the RF power supply 60 is controlled to turn on and off such that plasma is excited at the time when the NH$_3$ gas is supplied (FIG. 5, (D)). Consequently, plasma is generated pulsewise, so that by-product films are efficiently peeled off from the inner wall of the cover 56 due to a large impact force of plasma ignition and the sputtering action of plasma.

The thin film thus peeled off are forcibly carried by the flow of N$_2$ gas supplied from the nozzles 34 and 38, and are exhausted through the exhaust port 52. At this time, it suffices if N$_2$ gas is supplied from only one of the two nozzles 34 and 38. As described above, plasma is generated while a cleaning gas that can be excited into plasma is supplied, so that by-product films deposited on the inner wall are removed due to the sputtering action of plasma and so forth. Consequently, particle generation is satisfactorily suppressed in the plasma film formation process subsequently performed.

In the cleaning process, the pulse width T1 to turn on plasma is set to be 1 second to 10 minutes, such as about 5 seconds. The period T2 of one cycle from the rising edge of a pulse of supplying NH$_3$ gas to the rising edge of the next pulse is set to be 1 second to 10 minutes, such as about 25 seconds. The cleaning process is performed for, e.g., several hours, depending on the cumulative film thickness. The flow rate of NH$_3$ gas is set to be 0.1 to 10 liters/min, such as about 5 liters/min. The flow rate of N$_2$ gas supplied from the nozzle 34 is set to be 0.1 to 10 liters/min, such as about 3 liters/min. The flow rate of N$_2$ gas supplied from the nozzle 38 is set to be 0.1 to 10 liters/min, such as about 3 liters/min. The pressure inside the gas exciting section 50 is set for plasma to be generated, and is set to be not more than 10 Torr (1,333 Pa), such as 0.5 Torr, where NH$_3$ gas is used, for example. The temperature inside the process container 4 is set to be 300 to 800☐, such as about 650☐.

The electric power applied to the RF power supply 60 to generate plasma in the cleaning process is set to be 100 to 1000%, and preferably 120 to 500%, of the electric power applied to the RF power supply 60 to generate plasma in the plasma film formation process subsequently performed (Step S3). For example, the plasma electric power used in the plasma film formation process is set at, e.g., 300 watts, as described above, while the plasma electric power used in the cleaning process is set at, e.g., 350 watts. Consequently, almost all thin films that could be peeled off during the plasma film formation process are peeled off and removed by the cleaning process using an impact force provided by a large electric power. Consequently, particle generation is satisfactorily suppressed in the plasma film formation process.

In other words, when plasma is generated during the plasma CVD process, the electric power used at this time is smaller than the electric power used in the cleaning process. Unnecessary thin films that could be peeled off by a smaller impact force provided by a smaller electric power in the plasma CVD process have already been peeled off and removed by a larger impact force provided by a larger electric power in the cleaning process. Consequently, particle generation is satisfactorily suppressed in the plasma CVD process.

In this embodiment, NH$_3$ gas used as a cleaning gas that can be excited into plasma is a gas to be used in the subsequent plasma film formation process. In this case, there is no risk of an undesirable impurity being mixed into the film formed by the plasma film formation process. However, the cleaning gas may be any gas, as long as it includes no halogen atoms, such as F atoms or Cl atoms, and can be excited into plasma. For example, in place of $NH_3$ gas, an inactive gas, such as He, Ar, Ne, or Xe gas, may be used. Also in this case, there is no risk of an undesirable impurity being mixed into the film formed by the plasma film formation process.

Accordingly, the cleaning process can be performed in a short time and immediately followed by the subsequent plasma film formation process, so that the operation rate of the apparatus is improved. In this respect, if a halogen family gas, such as F or Cl family gas, is used as a cleaning gas, it takes time to satisfactorily remove residual components of the F or Cl family from the process container after the cleaning process. Further, a pre-coating process is required to set the inner wall of the process container at a predetermined condition, thereby decreasing the operation rate of the apparatus to a large extent. Accordingly, a halogen family gas is not suitable for this cleaning gas.

<Experiment>

Using the film formation apparatus shown in FIG. 1, an experiment was conducted to confirm the relationship of the cleaning process relative to the number of particles generated in the subsequent plasma film formation process. In a comparative example, a series of processes were performed in the following order: a thermal CVD process (plasma-less) [cumulative film thickness: 0.65 μm]→a plasma ALD process→a plasma ALD process→a thermal CVD process (plasma-less) [cumulative film thickness: 0.65 μm]→a plasma ALD process and a plasma ALD process. In a present example, a series of processes were performed in the following order: a thermal CVD process (plasma-less) [cumulative film thickness: 0.65 μm]→a cleaning process using plasma→a plasma ALD process→a plasma ALD process→and a plasma ALD process. After each of the processes, the number of particles of 0.18 μm or more deposited on the surface of samples of unloaded wafers W were counted while the surface was irradiated with light. As sample wafers W, three wafers were selected respectively from the top (TOP), center (CTR), and bottom (BTM) of the wafer boat 12.

Figure 6A:
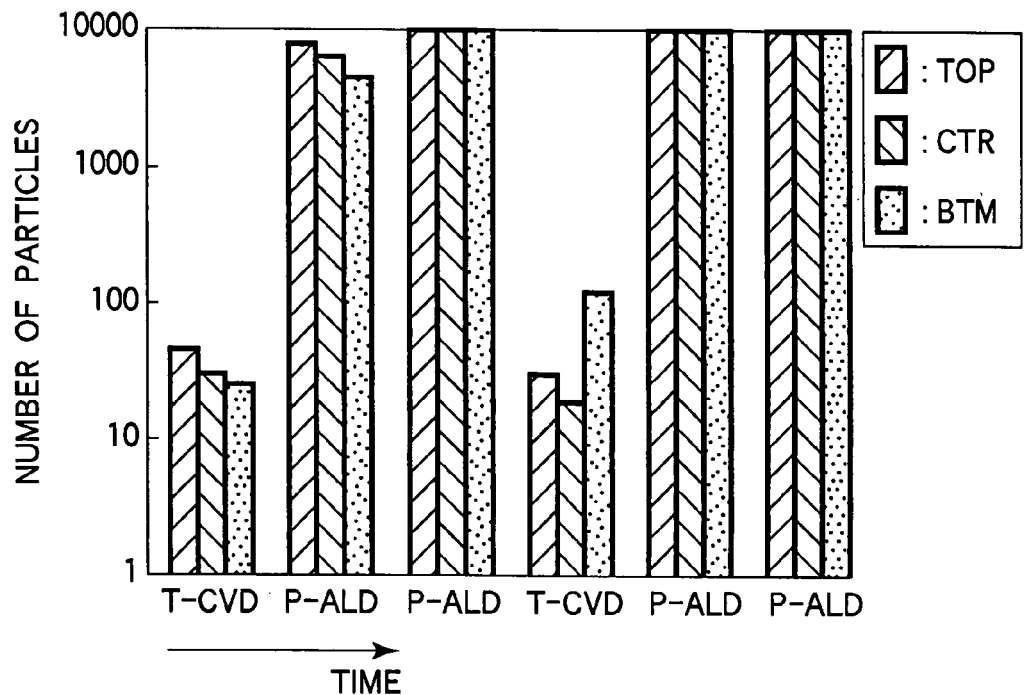
FIG. 6A is a graph showing a result concerning the number of particles obtained by a comparative example in an experiment.
Figure 6B:
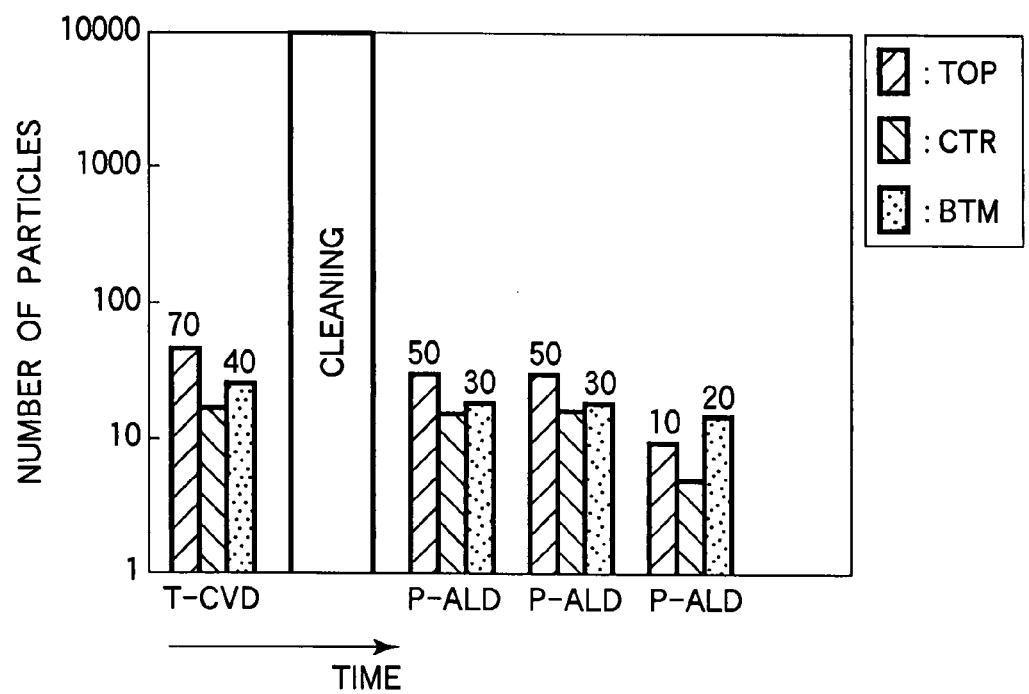
FIG. 6B is a graph showing a result concerning the number of particles obtained by a present example in the experiment.

FIG. 6A is a graph showing a result concerning the number of particles obtained by the comparative example in the experiment. FIG. 6B is a graph showing a result concerning the number of particles obtained by the present example in the experiment. In FIGS. 6A and 6B, "T-CVD" denotes a thermal CVD process, and "P-ALD" denotes a plasma ALD process.

In the case of the comparative example shown in FIG. 6A, when the plasma ALD processes were performed after each of the thermal CVD processes, a large number of particles were generated, such that the number of particles was 10,000 or more in each process. This was caused probably by the fact that unnecessary films deposited on the inner wall of the gas exciting section 50 in each thermal CVD process were peeled off and changed into particles by an impact force of plasma in each plasma ALD process In the case of the present example shown in FIG. 6B, when the three plasma ALD processes were continuously performed after the cleaning process, only a small number of particles were generated, such that the number of particles was about 50 at most in each process. Further, it was confirmed that, during the plasma ALD process, the sputtering action of plasma was always applied to the inner wall of the gas exciting section 50, and thereby prevented unnecessary films from being deposited thereon.

In the embodiment described above, as shown in FIG. 5, (D), the cleaning process is arranged to excite plasma pulsewise in synchronism with intermittent supply of $NH_3$ gas. However, as shown in FIG. 5, (E), plasma may be continuously generated, as a modification. In this case, since a large impact force of plasma ignition is applied once, the effect of peeling off unnecessary thin films becomes lower than that obtained in the case shown in FIG. 5, (D). However, even in this case, the unnecessary thin film can be sufficiently peeled off by the sputtering action of plasma. Further, the pulsated gas supply of $NH_3$ gas shown in FIG. 5, (A), may be modified to continuously supply $NH_3$ gas, although the gas consumption will be increased.

As shown in FIG. 3, where the gas distribution nozzle 38 is disposed inside the gas exciting section 50, $N_2$ gas may be continuously supplied from the nozzle 38, as shown in FIG. 5, (C), so as to promote removal of peeled by-product films from the gas exciting section 50. In this case, supply of $N_2$ gas from the other nozzle 34 shown in FIG. 5, (B), may be unnecessary.

In the embodiment described above, as shown in FIG. 4, the cleaning process (Step S2) is performed when film formation processes are switched from a plasma-less film formation process (Step S1), such as a thermal CVD process or thermal ALD or MLD process, to a plasma film formation process (Step S3), such as a plasma CVD process or plasma ALD or MLD process. However, regardless of plasma being used or not in a film formation process, the cleaning process using plasma according to the embodiment described above may be performed, when deposited by-product films reach a certain level. Consequently, it may be arranged such that, after a film formation process using or not using plasma is performed for certain lots of wafers, the cleaning process according to the embodiment described above is performed, and then a film formation process using or not using plasma is performed.

In the embodiment described above, for example, the first process gas contains DCS gas as a silane family gas. In this respect, the silane family gas may be one or more gases selected from the group consisting of dichlorosilane (DCS), hexachlorodisilane (HCD), monosilane ($SiH_4$), disilane ($Si_2Cl_6$), hexamethyl-disilazane (HMDS), tetrachlorosilane (TCS), disilylamine (DSA), trisilylamine (TSA), and bistertialbutylaminosilane (BTBAS).

In the embodiment described above, the second process gas contains a nitriding gas, which may be $NH_3$ gas or $N_2$ gas. Where the present invention is applied to formation of a silicon oxynitride film, an oxynitriding gas, such as dinitrogen oxide ($N_2O$) or nitrogen oxide (NO), may be used in place of the nitriding gas. Where the present invention is applied to formation of a silicon oxide film, an oxidizing gas, such as oxygen ($O_2$) or ozone ($O_3$), may be used in place of the nitriding gas. Further, a doping gas may be used for doping phosphorous or boron as an impurity. Further, in place of $N_2$ gas, another inactive gas, such as He, Ar, Ne, or Xe, may be used as an inactive gas for purging.

The present invention may be applied to a process for forming a film other than a silicon nitride film, silicon oxynitride film, and silicon oxide film. The types of films formed before and after the plasma cleaning process may be the same or different. The target substrate may be a substrate other than a semiconductor wafer, such as a glass substrate, LCD substrate, or ceramic substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a film formation apparatus for a semiconductor process, the apparatus comprising:

a process container having a vertically elongated process field configured to accommodate a plurality of target substrates, a support member configured to support the target substrates at intervals in a vertical direction inside the process field, a heater configured to heat the target substrates inside the process field, an exciting mechanism including a plasma generation area communicating with the process field and extending over a vertical length corresponding to the process field, with an electrode extending along the plasma generation area and configured to be supplied with an RF power for plasma generation, the plasma generation area being defined inside a cover attached on a sidewall of the process container with the electrode extending along an outside of the cover, a process gas supply system configured to selectively supply a silicon source gas, an ammonia gas, and an inactive gas into the process field, such that the silicon source gas is not supplied into the process field through the plasma generation area and the ammonia gas is supplied into the process field through the plasma generation area, and the silicon source gas and the ammonia gas are supplied to form essentially horizontal gas flows in the process field over a length corresponding to a vertical direction of the process field, and an exhaust system including an exhaust port disposed at a position facing the plasma generation area with the process field interposed therebetween and configured to exhaust gas from the process field, and the method comprising:

performing a first CVD process, while supplying the silicon source gas and the ammonia gas into the process field, thereby forming a first silicon nitride film on first target substrates inside the process field, the first CVD process being a thermal CVD process performed by heating the silicon source gas and the ammonia gas by the heater without generating any plasma;

unloading the first target substrates subjected to the first CVD process from the process container, and then performing a cleaning process of the plasma generation area and the process field; and then, performing a second CVD process, while supplying the silicon source gas and the ammonia gas into the process field, thereby forming a second silicon nitride film on second target substrates inside the process field, the second CVD process being a plasma CVD process performed by supplying the ammonia gas through the plasma generation area into the process field and generating plasma of the ammonia gas by the exciting mechanism while setting the RF power supplied to the electrode at a predetermined film formation electrical energy, wherein the cleaning process comprises:

intermittently supplying the ammonia gas pulsewise through the plasma generation area into the process field and supplying a first part of the inactive gas through the plasma generation area into the process field continuously along with or pulsewise alternately with the ammonia gas intermittently supplied, while continuously supplying a second part of the inactive gas into the process field, not through the plasma generation area, and while exhausting gas from the process field, and applying the RF power to the electrode pulsewise to turn on the exciting mechanism in synchronism with the ammonia gas intermittently supplied to thereby cause plasma ignition impacts while the RF power is set at a cleaning electrical energy, which is 120 to 500% of the film formation electrical energy so as to intermittently generate plasma of the ammonia gas pulsewise a plurality of times, the impact of the plasma ignition peeling off by-product films deposited on an inner wall of the cover where the plasma generation area is located.

2. The method according to claim 1, wherein the cleaning process comprises alternately supplying both the ammonia gas and the first part of the inactive gas both pulsewise.

3. The method according to claim 1, wherein the cleaning process comprises continuously supplying the first part of the inactive gas while intermittently supplying the ammonia gas.

4. The method according to claim 1, wherein the cleaning process uses a cleaning temperature of 300 to 800° C. set by the heater.

5. The method according to claim 1, wherein the second CVD process uses a film formation temperature of 300 to 650° C. set by the heater and comprises alternately supplying the silicon source gas, and the ammonia gas and intermittently generating plasma of the ammonia gas pulsewise a plurality of times by the exciting mechanism.

6. The method according to claim 1, wherein the first CVD process uses a film formation temperature of 650 to 800° C. set by the heater and comprises continuously supplying the silicon source gas and the ammonia gas at the same time.

7. The method according to claim 1, wherein the first CVD process uses a film formation temperature of 550 to 650° C. set by the heater and comprises alternately supplying the silicon source gas and the ammonia gas.

8. The method according to claim 1, wherein the support member is loaded into and unloaded from the process container along with the target substrates, and wherein the cleaning process is performed while the support member used for the first CVD process is set in an empty state and placed in the process container.

9. The method according to claim 1, wherein the silane source gas is selected from the group consisting of: dichlorosilane, hexachlorodisilane, monosilane, disilane, hexamethyldisilazane, tetrachlorosilane, disilylamine, trisilylamine and bistertialbutylaminosilane.

10. The method according to claim 1, wherein the inactive gas is selected from the group consisting of: $N_2$, He, Ar, Ne and Xe.

11. The method according to claim 1, wherein the inactive gas is formed of $N_2$ gas.

12. The method according to claim 1, wherein the cleaning process sets the plasma generation area at a pressure of not more than 10 Torr (1,333 Pa).

* * * * *